US011258378B2

(12) United States Patent
Lee et al.

(10) Patent No.: US 11,258,378 B2
(45) Date of Patent: Feb. 22, 2022

(54) PIEZOELECTRIC APPARATUS FOR MOTORIZATION

(71) Applicant: NATIONAL TAIWAN UNIVERSITY, Taipei (TW)

(72) Inventors: Chih-Kung Lee, Taipei (TW); Yu-Hsiang Hsu, Taipei (TW); Wen-Jong Wu, Taipei (TW); Tsung-Yu Chu, Taoyuan (TW); Yu-Min Lin, Puzi (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 333 days.

(21) Appl. No.: 16/424,835

(22) Filed: May 29, 2019

(65) Prior Publication Data

US 2019/0372483 A1 Dec. 5, 2019

Related U.S. Application Data

(60) Provisional application No. 62/677,229, filed on May 29, 2018.

(51) Int. Cl.
*H02N 2/02* (2006.01)
*H01L 41/09* (2006.01)
*H02N 2/06* (2006.01)

(52) U.S. Cl.
CPC .......... *H02N 2/021* (2013.01); *H01L 41/0926* (2013.01); *H02N 2/065* (2013.01)

(58) Field of Classification Search
CPC .......... H02N 2/021; H02N 2/065; H02N 2/08; H02N 2/062; H02N 2/028; H01L 41/0926
See application file for complete search history.

(56) References Cited

U.S. PATENT DOCUMENTS

| 5,898,243 A * | 4/1999 | Dona ................. B23Q 5/28 |
| | | 310/12.05 |
| 7,355,325 B2 * | 4/2008 | Johansson ........... H02N 2/021 |
| | | 310/328 |
| 11,114,954 B2 * | 9/2021 | Wischnewskiy ..... H02N 2/0075 |

OTHER PUBLICATIONS

Hariri et al., "Dual piezoelectric beam robot: The effect of piezoelectric patches' positions", Journal of Intelligent Material Systems and Structures, vol. 26(18), 2015, pp. 2577-2590.

(Continued)

*Primary Examiner* — Emily P Pham
(74) *Attorney, Agent, or Firm* — Allen, Dyer, Doppelt + Gilchrist, P.A.

(57) ABSTRACT

A piezoelectric motorization system has a mechanically flexible body that has one or more surfaces for placing piezoelectric actuators. The system has groups of piezoelectric actuators each positioned on one of the surfaces of the mechanically flexible body that is connected to the electronic circuitry. The electronic circuitry controls the driving of the mechanical loads by the mechanically flexible body by injecting sets of control signals into different groups of actuators positioned on the mechanically flexible body. Each control signal operates groups of driving frequencies with an adjustable amplitude ratio and an adjustable phase difference among driving frequencies. And, under a set of boundary conditions exhibited by a set of structural dimensions of the mechanically flexible body, each control signal induces multi-mode resonance of the mechanically flexible body for driving the mechanical loads multi-dimensionally.

18 Claims, 15 Drawing Sheets

(56) References Cited

OTHER PUBLICATIONS

Hariri et al., "A traveling wave piezoelectric beam robot", Smart Materials and Structures, IOP Publishing Ltd, 2014, pp. 1-9.
Lee, "Theory of laminated piezoelectric plates for the design of distributed sensors/actuators. Part I: Governing equationsand reciprocal relationships", Acoustical Society of America 87, 1990, pp. 1144 1158.
Tomikawa et al., "Excitation of a progressive wave in a flexurally vibrating transmission medium", Japanese Journal of Applied Physics, vol. 29, supplement 29-1, 1990, pp. 179-181.

* cited by examiner

PIEZOELECTRIC APPARATUS FOR MOTORIZATION

CROSS REFERENCE TO RELATED APPLICATION

This application claims the benefit of priority to U.S. Provisional Application Ser. No. 62/677,229, filed 29 May 2018. The disclosure of the prior application is hereby incorporated in its entirety by reference.

BACKGROUND

Field of the Invention

The present invention relates in general to piezoelectric motorization. Particularly, the present invention relates to a method and a piezoelectric motorization system driving by the method to implement motorization. More particularly, the present invention relates to a piezoelectric motorization system for driving mechanical loads multi-dimensionally by an electronic circuitry that generates multiple control signals based on the method.

Description of the Related Art

The Piezoelectric linear motor that is based on generating traveling waves on a one-dimensional structure has superior advantages of simple structure, light weight and low cost. It has been reported that using the method of one-frequency-two-mode (two-mode excitation) to drive a piezoelectric linear motor, the natural resonant effect induced by the finite boundaries that converts traveling waves back to standing waves such that no driving motion can be created is eliminated (Tomikawa Y, Adachi K, et al. "Excitation of a Progressive Wave in a Flexurally Vibrating Transmission Medium." *Proc. 10th Symp. Ultrason. Electron.* 1990; Hariri H, Bernard Y and Razek A "A traveling wave piezoelectric beam robot." *Smart Mater. Struct.* 2014). The structure of the piezoelectric linear motor is based on placing two piezoelectric actuators on a one-dimensional finite plate. This method uses a single driving frequency at the middle of two adjacent bending modes to drive these two piezoelectric actuators with a 90° phase difference, and a traveling wave can be generated. This traveling wave can be used to move an object, or a mechanical load, placed on the motor surface, or it can be used to propel the motor moving toward a certain direction.

There are very limited methods that can generate traveling waves on a finite structure for the application of motorization. This is because the resonant effect dominates the resultant vibrations after actuation, where generated traveling waves can quickly convert into standing waves. Based on the vibration theorem, the external force agitation can be expanded with a corresponding weighting function into orthogonal resonant modes. Therefore, the operating frequency of the one-frequency-two-mode excitation is selected to be at the middle of two adjacent resonant modes to excite the two adjacent resonant modes. However, using the frequency at the middle of the natural frequency is not necessarily suitable for the superposition of these two modes. The spill-over of driving energy can reduce the efficiency of the operation. Furthermore, a power amplifier is needed to provide sufficient energy to drive the liner motor. But, it is not an efficient driving method since the operating frequency is not at or sufficiently close to the resonant frequency. Finally, the method to use traveling waves on a finite piezoelectric structure to generated two-dimensional and three-dimensional motion is still not clear. In this invention, we present a method and a piezoelectric system that can be applied for one-dimensional, two-dimensional and three-dimensional motorizations.

SUMMARY OF THE INVENTION

It is an object of the present invention to provide a piezoelectric motorization system for driving mechanical loads multi-dimensionally by an electronic circuitry.

It is also an object of the present invention to provide a piezoelectric motorization system that the piezoelectric apparatus of this system is used to move a mechanical load placed on its surface for one-dimensional or two-dimensional movement.

It is still an object of the present invention to provide a piezoelectric motorization system that the piezoelectric apparatus of this system is self-propelled for movement.

It is yet an object of the present invention to provide a piezoelectric motorization system that the piezoelectric apparatus places against a mechanical load to push this mechanical load multi-dimensionally.

It is yet an object of the present invention to provide a method to generate multi-directional traveling waves on the piezoelectric apparatus of the piezoelectric motorization system for motorization.

In an implementation of the piezoelectric motorization system for driving mechanical loads multi-dimensionally by an electronic circuitry having a mechanically flexible body and at least two groups of multiple piezoelectric actuators. Each actuator is positioned on one of the surfaces of the mechanically flexible body at a corresponding actuating area and is electrically connected to a corresponding output of the electronic circuitry. The electronic circuitry controls the driving of the mechanical loads by the mechanically flexible body by injecting at least two sets of control signals respectively into different groups of actuators positioned on the mechanically flexible body. Furthermore, each control signal has at least two groups of driving frequencies with an adjustable amplitude ratio and an adjustable phase difference among driving frequencies. The mechanically flexible body has a set of boundary conditions that determine its multi-mode resonances that are used for generating traveling waves for driving the mechanical loads multi-dimensionally.

In an implementation of the piezoelectric motorization system for driving mechanical loads multi-dimensionally by an electronic circuitry having a mechanically flexible body constructed by at least one layer of piezoelectric plate and at least two groups of paired electrodes placed on the top and the bottom surface of each piezoelectric plate. These paired electrodes are electrically connected to a corresponding output of the electronic circuitry. The electronic circuitry controls the driving of the mechanical loads by the mechanically flexible body by injecting at least two sets of control signals respectively into different groups of paired electrodes positioned on the piezoelectric plate. Furthermore, each control signal has at least two groups of driving frequencies with an adjustable amplitude ratio and an adjustable phase difference among driving frequencies. The mechanically flexible body has a set of boundary conditions that determine its multi-mode resonances that are used for generating traveling waves for driving the mechanical loads multi-dimensionally.

In an implementation of the piezoelectric motorization system for driving mechanical loads of a three-dimensional mass multi-dimensionally by an electronic circuitry having at least three mechanically flexible bodies placed adjacent to one of three mutually orthogonal surfaces of the three-dimensional mass. Each mechanical body has at least two groups of multiple piezoelectric actuators, and each group of piezoelectric actuators is positioned on one of the surfaces of each mechanically flexible body at a corresponding actuating area and is electrically connected to a corresponding output of the electronic circuitry. The electronic circuitry controls the driving of the mechanical loads by the mechanical body by injecting at least two sets of control signals respectively into different groups of actuators positioned on each mechanically flexible body. Furthermore, each control signal has at least two groups of driving frequencies with an adjustable amplitude ratio and an adjustable phase difference among driving frequencies. Each mechanically flexible body has a combination of a set of boundary conditions that determine its multi-mode resonances that are used for generating traveling waves for driving the three-dimensional mass multi-dimensionally and moving it one the corresponding plane of one of the three mutually orthogonal surfaces by at least three mechanically flexible bodies.

In an implementation of a method to control the piezoelectric motorization system for driving mechanical loads multi-dimensionally by an electronic circuitry. The system having a mechanically flexible body and at least two groups of multiple piezoelectric actuators. Each actuator is positioned on one of the surfaces of the mechanically flexible body at a corresponding actuating area and is electrically connected to a corresponding output of the electronic circuitry. This method is to use the electronic circuitry to inject at least two sets of control signals respectively into different groups of actuators positioned on the mechanically flexible body for controlling the driving of the mechanical loads by the mechanically flexible body. Each control signal has at least two groups of driving frequencies of the mechanically flexible body with an adjustable amplitude ratio and an adjustable phase difference among driving frequencies. The mechanically flexible body has a set of boundary conditions that determine its multi-mode resonances that are used for generating traveling waves for driving the mechanical loads multi-dimensionally.

In an implementation of the piezoelectric motorization system wherein each driving frequency is at or near one resonant frequency of the mechanically flexible body and all driving frequencies are different and adjacent to each other.

In an implementation of the piezoelectric motorization system wherein each driving frequency is at or near one resonant frequency of the mechanically flexible body and all driving frequencies are different and not adjacent to each other.

In an implementation of the piezoelectric motorization system wherein each driving frequency is at or near one resonant frequencies of the mechanically flexible body and each driving frequency has an integer relationship with respect to each other.

In an implementation of the piezoelectric motorization system wherein the driving frequencies are at or near the frequencies of out-of-plane resonant modes of the mechanically flexible body, including bending and/or twisting modes.

In an implementation of the piezoelectric motorization system wherein the driving frequencies for each piezoelectric actuator is the superposition of at least one frequency at or near different resonant modes of the mechanically flexible body. Furthermore, these driving frequencies for each group of piezoelectric actuators are different.

In an implementation of the piezoelectric motorization system wherein the size, shape and location of all piezoelectric actuators determine the motorization direction and velocity.

DETAILED DESCRIPTION

Figure 1A:
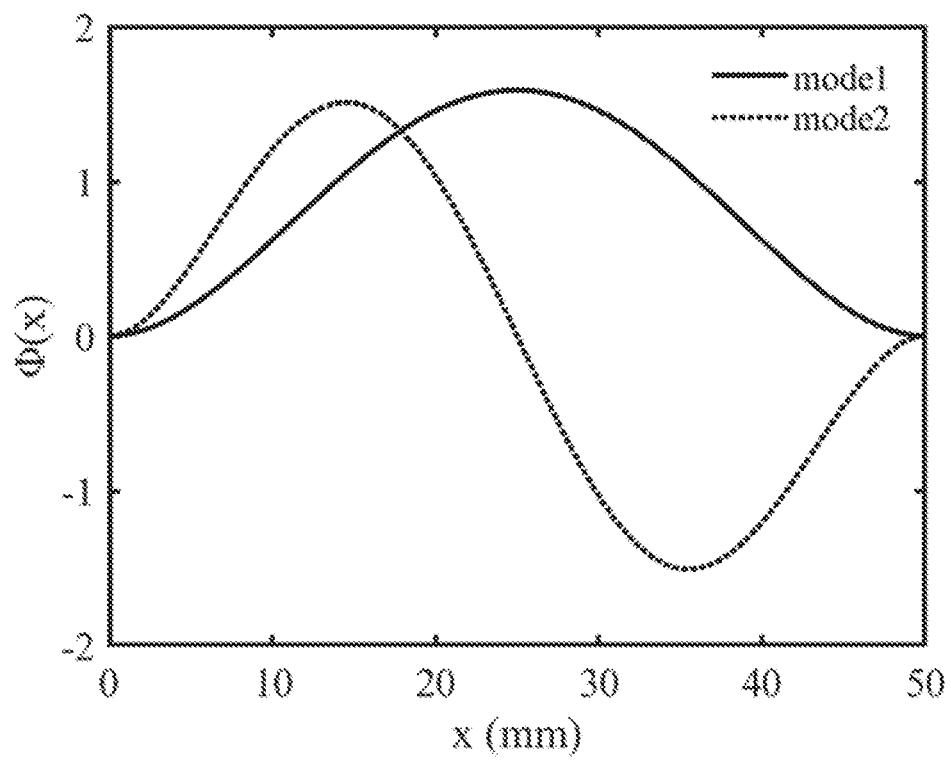
FIG. 1A graphs the chosen first bending modes and the second bending modes used for a linear piezoelectric apparatus of a 1-D plate with a fixed-fixed boundary conditions.

The present invention discloses a piezoelectric motorization system and, in particular, a piezoelectric apparatus to be operated on at or near at least two resonant modes by using the method of multi-frequency-multi-mode to generate traveling waves for motorization. More particularly, the direction and velocity of the motorization can be controlled by an electronic circuitry that control the ratio of amplitudes, phase difference, and resonant frequencies, and resonant modes that drive multiple piezoelectric actuators attached to a mechanically flexible structure. Or, the mechanically flexible body itself is a piezoelectric composite with multiple paired electrodes coated on each layer of piezoelectric plates. Different resonant frequencies can be used to drive different groups of actuating areas on the piezoelectric apparatus for generating traveling waves that propagate in a determined direction. The piezoelectric apparatus can be a one-dimensional structure that uses bending modes to generation traveling for motorization. The piezoelectric apparatus can also be a two-dimensional structure that uses bending and/or twisting modes to generate two-dimensional traveling waves for motorization. Finally, three sets of the two-dimensional piezoelectric apparatus of the present invention can be placed adjacent to three orthogonal faces of a three-dimensional mass to generate three-dimensional motorization.

The driving method of the present invention is based on stimulating multiple resonant modes with a controlled amplitude ratio, temporal phase different and spatial amplitude ratio and phase difference. The direction and velocity of the piezoelectric apparatus is controlled by the electronic circuitry that control the ratio of voltage amplitudes and the phase difference among every driving frequencies. The direction and velocity of the piezoelectric apparatus is also controlled by the spatial design of multiple actuating areas, including the size, shape and locations. This driving method is different from previous reported method that uses a single frequency located between two adjacent bending modes to generate traveling waves for motorization.

According to the present invention, the driving voltage and velocity of generated traveling waves on a piezoelectric apparatus has a linear relationship, and the size, shape and location of actuators or actuating areas can also influence the distance of generated traveling waves. In this invention, we apply the method of multi-frequency-multi-mode that uses at least two frequencies at or near resonant frequencies or at least two frequencies at or near resonant frequencies with integer multiplications to generate traveling waves for motorization. Taking a linear piezoelectric apparatus of the present invention driven by two actuators and at two bending modes, we named two-frequency-two-mode, as an example. Since the operating frequencies of the two actuators are at or near resonant frequencies, the efficiency can be very high and the performance of the induced traveling waves can be controlled significantly. Furthermore, the total distance and profile of the traveling waves can also be different and be adjusted by using an electronic circuitry to control the driving frequencies, amplitudes, actuating areas or phase difference between piezoelectric actuators. Furthermore, the two driving frequencies with different amplitude and phase differences are used to control the direction and amplitude of generated traveling waves. Thus, the energy that falls into the two modes can be changed in temporal domain, and the ratio of vibrating amplitudes of these two modes can be adjusted. The total traveling distance can be much enhanced by controlling the driving amplitude and phase difference between two actuators by using two resonant frequencies. Based on the same concept, this driving method can be expanded to a larger scale with multiple actuating areas and be applied to two-dimensional, and three-dimensional piezoelectric motors to create linear, rotary, or other complex motions.

Based on linear piezoelectric theory, the theory of piezoelectric laminates is used to model a linear piezoelectric motor (C. K. Lee, "Theory of laminated piezoelectric plates for the design of distributed sensors/actuators. Part I: Governing equations and reciprocal relationships." The Journal of the Acoustical Society of America, 87(3), 1144-1158, 1990). The governing equation can be derived by substituting the following equation (1) to the Newton's second law of motion (2)

$$\begin{bmatrix} M_1 \\ M_2 \\ M_6 \end{bmatrix} = \begin{bmatrix} B_{11} & B_{12} & B_{16} \\ B_{12} & B_{22} & B_{26} \\ B_{16} & B_{26} & B_{66} \end{bmatrix} \begin{bmatrix} S_1 \\ S_2 \\ S_6 \end{bmatrix} + \begin{bmatrix} D_{11} & D_{12} & D_{16} \\ D_{12} & D_{22} & D_{26} \\ D_{16} & D_{26} & D_{66} \end{bmatrix} \begin{bmatrix} k_1 \\ k_2 \\ k_6 \end{bmatrix} - \sum_{k=1}^{n} z_k(V_3) \begin{bmatrix} e_{31} \\ e_{32} \\ 0 \end{bmatrix} \quad (1)$$

$$\frac{\partial^2 M_1}{\partial x^2} + 2\frac{\partial^2 M_6}{\partial x \partial y} + \frac{\partial^2 M_2}{\partial y^2} = \rho h \frac{\partial^2 w}{\partial t^2} \quad (2)$$

It should be noted that $[M_i]$ are the bending moment, $[B_{ij}]$ and $[D_{ij}]$ are moment of inertia and flexural stiffness, $[S_i]$ represents strain, $[k_i]$ are the curvature in the plane or the twist of the surface, $z_k$ represent the moment arm of the plate where k=1 and 2 representing the first and the second layer, $[e_{ij}]$ is piezoelectric stress matrix, $\rho$ is density, h is the thickness of a thin plate. Because aspect ratio between length and width were more than 10:1, out-of-plan motion dominates this one-dimensional thin plate and it is a function of x only. The governing equation can be written as $$D_{11}\frac{\partial^4 w}{\partial x^4} + \rho h \frac{\partial^2 w}{\partial t^2} = -\sum_{k=1}^{n} \frac{\partial^2}{\partial x^2} \{\delta_{ep} e_{31} z_k [V_1(x,t) + V_2(x,t)]\}_k \quad (3)$$

where δ represents the polarization direction of the piezoelectric material, $V_1(x,t)$ and $V_2(x,t)$ are the corresponding left and right surface electrodes of the piezoelectric actuators. Using the concept of the effective surface electrodes (H. Hariri. Y. Bernard, and A. Razek, "Dual piezoelectric beam robot: The effect of piezoelectric patches positions," Journal of Intelligent Material Systems and Structures, 26(18), 2577-2590, 2015), Eq. (3) can be written as $$D_{11}\frac{\partial^4 w}{\partial x^4} + \rho h \frac{\partial^2 w}{\partial t^2} = \frac{h}{2}e_{31}\{\overline{V_1}[\delta'(x-x_1) - \delta'(x-x_2)]\sin(\omega_1 t) + \qquad (4)$$
$$\overline{V_2}[\delta'(x-x_3) - \delta'(x-x_4)]\sin(\omega_2 t + \theta)\}$$

Considering an example of a linear piezoelectric apparatus with a structure of fixed-fixed boundary conditions, we use separation of variables and Laplace transform to solve Eq. (4). We chose bending mode 1 and mode 2 to be the two adjacent modes to generate traveling waves, the derived displacement field from Eq. (4) can be expressed as $$w_1 = \cosh(\sqrt{\lambda_1}\,x) - \cos(\sqrt{\lambda_1}\,x) - \alpha_1[\sinh(\sqrt{\lambda_1}\,x) - \sin(\sqrt{\lambda_1}\,x)] \times \qquad (5)$$
$$\frac{e_{31}}{2\rho K_1 \omega_1}V_1[\Phi'_1(x_1) - \Phi'_1(x_2)]\left[\frac{1}{\omega_1}\sin(\omega_1 t) - t\cos(\omega_1 t)\right]$$

and $$w_2 = \cosh(\sqrt{\lambda_2}\,x) - \cos(\sqrt{\lambda_2}\,x) - \qquad (6)$$
$$\alpha_2[\sinh(\sqrt{\lambda_2}\,x) - \sin(\sqrt{\lambda_2}\,x)] \times \frac{e_{31}}{2\rho K_2 \omega_2}\overline{V_2}[\Phi'_2(x_3) - \Phi'_2(x_4)] \times$$
$$\left\{\left[\frac{1}{\omega_2}\sin(\omega_2 t) - t\cos(\omega_2 t)\right] \times \cos\theta + [t\sin(\omega_2 t)] \times \sin\theta\right\}$$

Figure 1B:
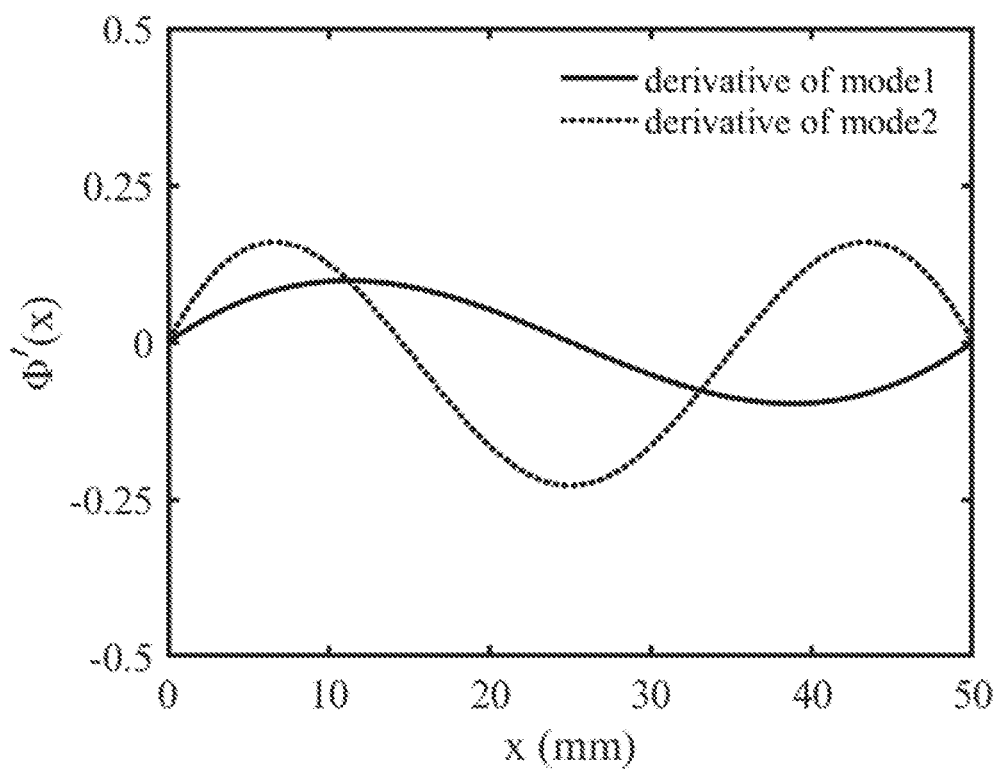
FIG. 1B graphs the chosen derivatives of the first bending modes and the second bending modes used for a piezoelectric apparatus of a 1-D plate with a fixed-fixed boundary conditions.

In Eqs. (5) and (6), it shows that the size, shape and location of electrodes ($[\Phi_1'(x_1) - \Phi_2'(x_2)]$ and $[\Phi_3'(x_3) - \Phi_2'(x_2)]$) can increase or decrease the amplitude of generated traveling waves. It also can change the sign of the amplitude by selecting the position of the electrodes. Thus, we compare distributions of displacement and bending angle of the first and the second bending modes, where they are shown in FIGS. 1A and 1B, respectively. As shown in Eqs. (5) and (6), the value of derivative bending angle $\Phi'(x)$ can improve the amplitude of wave motion and also the sign of each wave. It determines the amplitude ratio in spatial domain and also the spatial phase difference. This can determine the direction and velocity of generated traveling waves and thus the performance of motorization.

Figure 2:
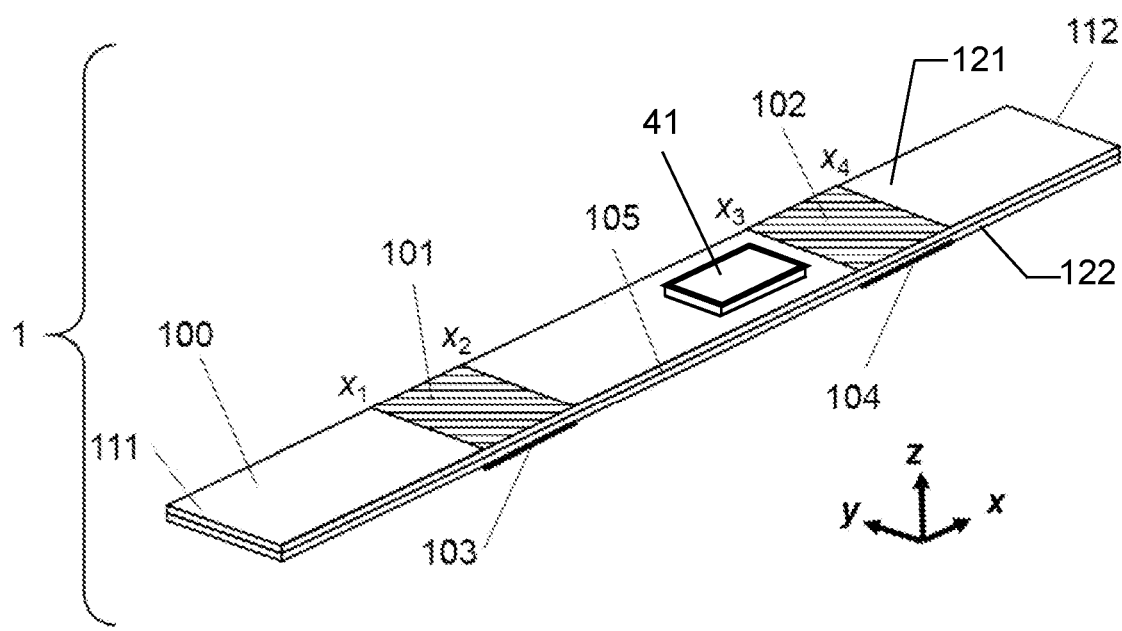
FIG. 2 graphs an example of a one-dimensional linear piezoelectric apparatus designed based on two-frequency-two-mode method.
Figure 3A:
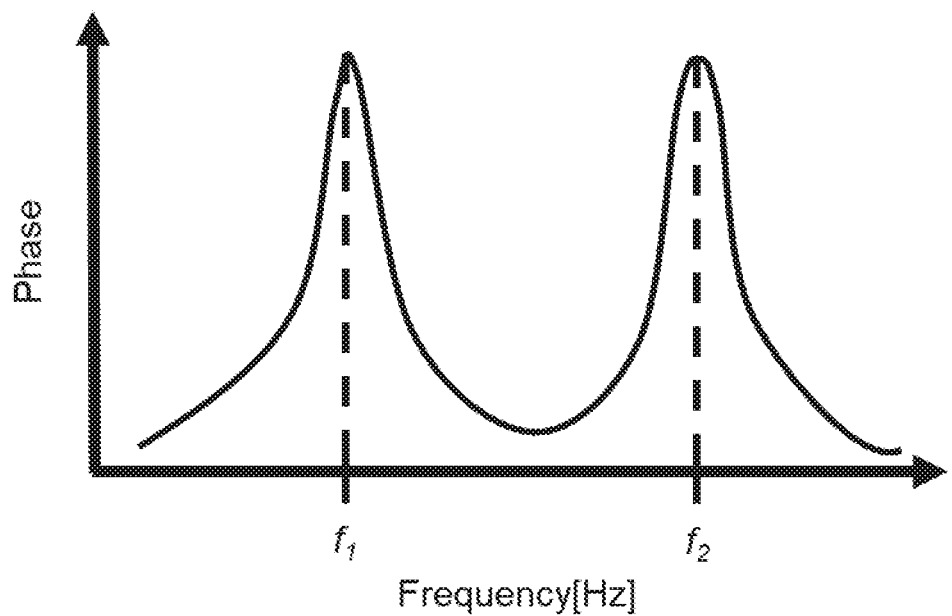
FIG. 3A graphs the choice of the two driving frequencies for generating a traveling wave.

The embodiment of this invention for two-frequency-two-mode linear piezoelectric apparatus 1 for motorization is illustrated in FIG. 2A, where the first and the second bending modes were chosen ($f_1$ & $f_2$). The structure of the piezoelectric apparatus is constructed by a piezoelectric bimorph 100 with a layer of electrode 105 bonded in between. The piezoelectric bimorph has two layers of piezoelectric plates and it constructed as the mechanically flexible body of the present invention. The surface electrodes 101, 102, 103, 104 determine the two actuating areas of the piezoelectric apparatus. They are placed on the top 121 and the bottom surface 122 of the piezoelectric bimorph 100. The boundary conditions 111 and 112 determine the mode shape of the bending modes. Based on this method, the electronic circuitry controls the phase difference between these two actuating areas and the amplitude ratio are designed so that the direction and velocity of traveling waves can be generated and controlled for motorizing a mechanical load 41. In this example, one actuating area is driven on the first bending mode ($f_1$), and the other is driven on the second bending mode ($f_2$) with a controlled amplitude ratio and phase difference with respect to the first one, as illustrated in FIG. 3A. Note also that the chosen two bending modes do not need to be two adjacent bending modes. It also can be any two bending modes vibrate along the same axis. In most general cases, the two modes need not to be bending modes either.

Figure 3B:
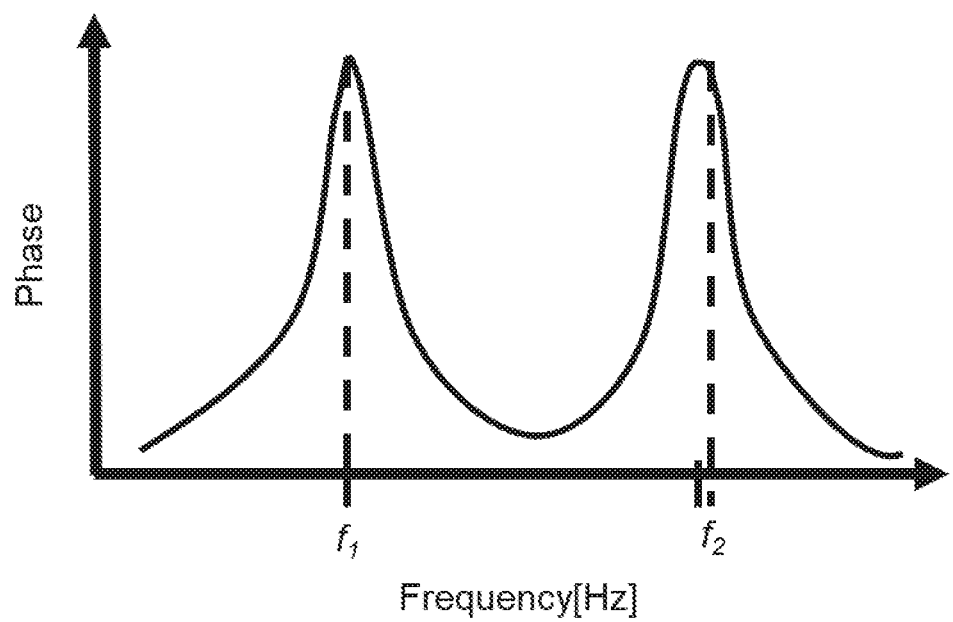
FIG. 3B graphs the choice of the two driving frequencies with a relationship of integer multiplication for generating a traveling wave.

Considering another embodiment of the present invention, the two boundary condition of the linear piezoelectric apparatus are simply-supported on two sides (111 and 112), the mode shapes of bending vibrations are sine functions. Traveling waves can be generated on the piezoelectric apparatus by using at least two actuating areas that operate at two difference frequencies at or near the resonant frequencies with relationships of integer multiplications for motorization. It can be expressed with the following equations:

$$w = \sum_{n=1}^{m} A_n \sin(n\omega_1 t + \theta_n). \qquad (7)$$

where $A_n$, $n\omega_1$, and $\theta_n$ are amplitude, driving frequency, and temporal phase difference for the n-th actuators. The frequency of actuating areas for $n>1$ are integer of the first driving frequency $n\omega_1$, where n is an integer larger than 1. The amplitude and direction of traveling waves can be induced and controlled by controlling the amplitude ratio among $A_n$ with respect to $A_1$, and the phase difference of $\theta_n$ with respect to $\theta_1$. The amplitude and sign of $A_n$ is determined by the size, shape and location of multiple actuating area, and its sign also is determined by the actuating area. These multiple driving signals are applied to at least two actuating areas to generate traveling waves for motorization. FIG. 3B shows an example of this driving method for two-frequency-two-mode, where the driving frequency of $f_2$ is near the resonant frequency of the second bending mode. Its frequency is 2 times larger than $f_1$, where $f_2 = 2 f_1$. The first actuating area is driven at $f_1$ with an amplitude of $A_1$, and the second actuating area is driven at $f_2$ that is 2 times higher than $f_1$ and it is still in the range of the resonant mode. The amplitude of $A_2$ and $\theta_2$ are also controlled to have a pre-determined relationship with respect to $A_1$ and $\theta_1$ for controlling the direction and velocity of generated traveling waves on the piezoelectric apparatus for motorization.

Figure 4:
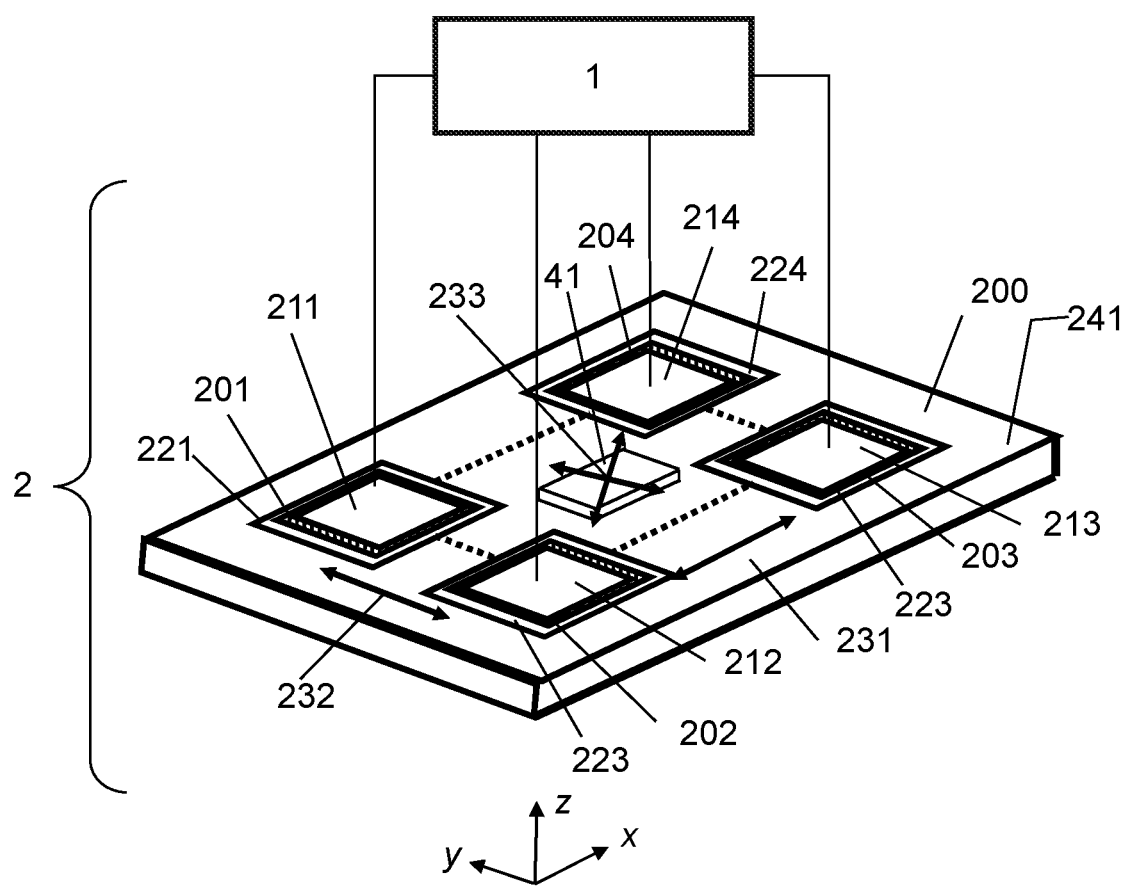
FIG. 4 illustrates the piezoelectric apparatus of the present invention for two-dimensional application.

In an embodiment of this invention summarized in FIG. 4, the piezoelectric motorization system has an electronic circuitry 1 and a piezoelectric apparatus 2. The piezoelectric apparatus 2 includes a mechanically flexible structure 200, at least two piezoelectric actuators (201, 202, 203, 204, and so on), and at least two top electrodes (211, 212, 213, 214), and at least four bottom electrodes (221, 222, 223, 224). This piezoelectric apparatus can generate traveling waves in different directions (231, 232, 233) and velocity for motorization applications, including self-propelled movement or push a mechanical load 41 placed on its surface. Each piezoelectric actuator or a group of multiple piezoelectric actuators is driven at or near the resonant frequency of multiple chosen resonant modes. These resonant modes can be adjacent to each other or at any two resonant modes of any kind, including bending and twisting. Or, these driving frequencies have a relationship of integer multiplications. Straight traveling waves can be generated by two or multiple bending modes. Oblique traveling waves can be generated by a bending mode and a twisting mode. The traveling wave is generated by controlling the ratio of driving amplitude and phase difference, where they can be controlled temporally by using the electronic circuitry 1 or spatially by design of the size, shape and location of the actuating areas.

FIG. 4 is an illustration of the present invention. The piezoelectric apparatus 2 includes a mechanically flexible body 200 and multiple piezoelectric actuators attached on one of its surfaces. This body can be any geometry to have multiple decouple bending modes and twisting modes. There are at least two piezoelectric actuating area (201, 202, 203, 204, and so on), and at least two top electrodes (211, 212, 213, 214, and so on), and at least four bottom electrodes (221, 222, 223, 224, and so on). They are placed on one of the surfaces 241 of the mechanical flexible body 200. The boundary conditions can be any kind, including free end, fixed end, or simply supported. This piezoelectric apparatus can generate traveling waves in different directions (231, 232, 233) and velocity for motorization applications, including self-propelled movement or push a mechanical load 41 placed on its surface.

For example, the geometry of the mechanically flexible body can be a rectangular plate with identical or different boundary condition on each edge with only four groups of actuating areas 201, 202, 203, 204. The actuating areas 201 and 202 are synchronized by the electronic circuitry 1, and the driving areas 203 and 204 are also synchronized separately by the electronic circuitry 1. The driving frequencies of these two groups of actuating areas are chosen to be at or near any two different bending modes. For example, it can be at or near two adjacent bending modes as indicated by driving frequencies at $f_1$ and $f_2$ shown in FIG. 3A or 3B. One group is driving at frequency of the lower bending mode $f_1$, and the other group is driving at the other higher bending mode $f_2$. Traveling waves can be generated along x-axis 231 by controlling the ratio of driving amplitudes, and phase difference between them. The direction of the traveling wave can be controlled by the phase difference between two driving signals. The direction and velocity can also be controlled by the amplitude ratio and phase difference. Similarly, the driving direction can be controlled to move along y-axis by grouping actuating area 201 and 204 to the first group and grouping 202 and 203 to the second group. Traveling waves can be generated and controlled by the same method.

The traveling direction can also be controlled to move diagonally or in an oblique direction 233 on x-y plane. This can be generated by driving the actuating areas at a bending mode and a twisting mode where their resonant frequencies are adjacent to each other or not adjacent to each other. The chosen bending and twisting modes can be two modes adjacent to each other as shown in FIG. 4, where one is bending mode and the other one is twisting mode. A group of actuators are driven at or near the frequency of the first bending mode and the other are driven at or near the frequency of the second twisting mode, or vice versa. The direction and velocity of traveling wave can be controlled by the ratio of driving amplitudes, and phase difference between two them. The direction of the traveling wave can also be controlled by the phase difference between two driving signals.

As another example of the present invention shown in FIG. 4. The driving groups of the four actuating areas can be selectively driven by the electronic circuitry 1, and the direction of traveling wave can be controlled to be 231, 232, and 233. The driving frequencies, ratio of driving amplitudes, and phase difference are the parameters for direction control.

As another example of the present invention shown in FIG. 4. Multiple piezoelectric actuators are used to generate traveling waves. Furthermore, the size, shape and location of the piezoelectric actuators can be used to design the ratio of driving amplitudes and phase difference in spatial domain.

As another example of the present invention shown in FIG. 4. Different superposition of resonant frequencies is applied to different groups of piezoelectric actuators. The amplitude ratio and phase difference are designed to control the moving direction and velocity.

Furthermore, the size, shape and location of the piezoelectric actuators can be used to design the ratio of driving amplitudes and phase difference in spatial domain.

Figure 5A:
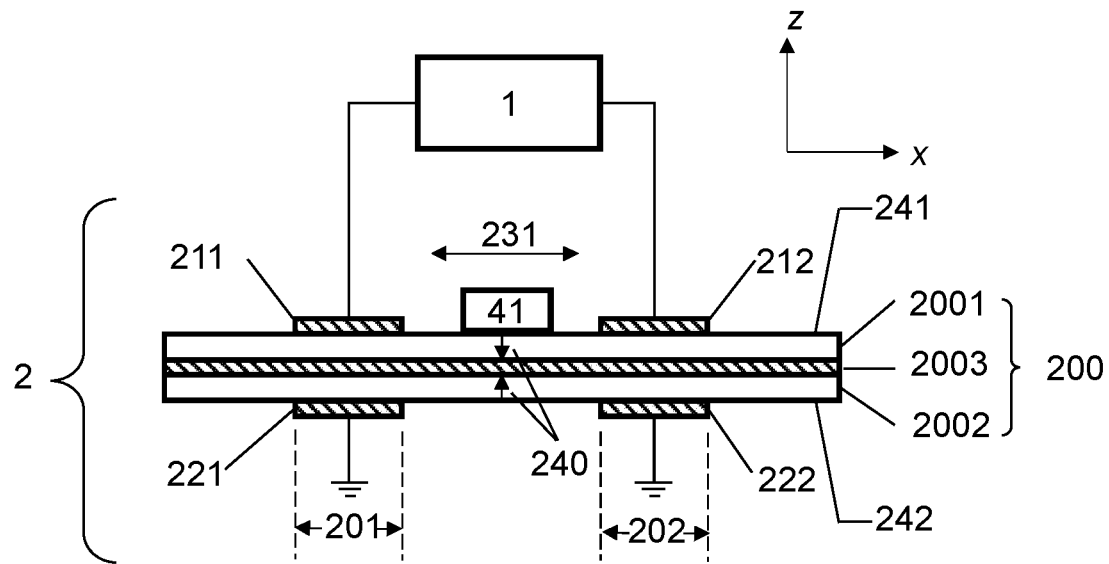
FIG. 5A graphs a two-frequency-two-mode linear piezoelectric apparatus having two one-dimensional plates to serve as its mechanically flexible body, where the poling direction are in opposite direction.

FIG. 5A shows an example of the present invention, the mechanically flexible body 200 of the piezoelectric apparatus 2 is constructed by two one-dimensional piezoelectric plate 2001, 2002, and an electrode 2003 sandwiched and bounded in between these two piezoelectric plates. The length of the mechanical flexible body is much longer than its width, and the width is also much larger than its thickness. Symmetry boundary conditions can be used, including free-free, fixed-fixed, or simply supported on both ends. The poling direction 240 of these two piezoelectric plates are in opposite directions. Two sets of paired electrodes are coated on the piezoelectric plates, including two top electrodes 211 and 212 are coated on the top surface 241, and another two bottom electrodes 221 and 222 are coated on the bottom surface 242. These two pairs of the top and bottom electrodes define two actuating areas 201 and 202. The sizes, shapes and locations of these two actuating areas are designed to generate traveling waves by using two bending modes. The two bottom electrodes are grounded and the two upper electrodes are connected and driven by the electronic circuitry 1. The frequencies of the two driving signals send to the two top electrodes are controlled to be at or near frequencies of two adjacent bending modes or any two bending modes along x-axis. One is at or near the frequency of the first bending mode, and the other is at or near the frequency of the second bending mode. The ratio of driving amplitude and phase difference between these two driving signals also are controlled to generate traveling waves on the piezoelectric apparatus with a desired direction 231. The phase difference between these two driving signals can be changed to control the traveling wave moves toward positive or negative directions along x-axis. The trajectory of the peak amplitude of the traveling wave is a rotational motion on the x-z plane. This motion can be used to propel the piezoelectric apparatus itself or to push a mechanical load 41 places on its surface.

Figure 5B:
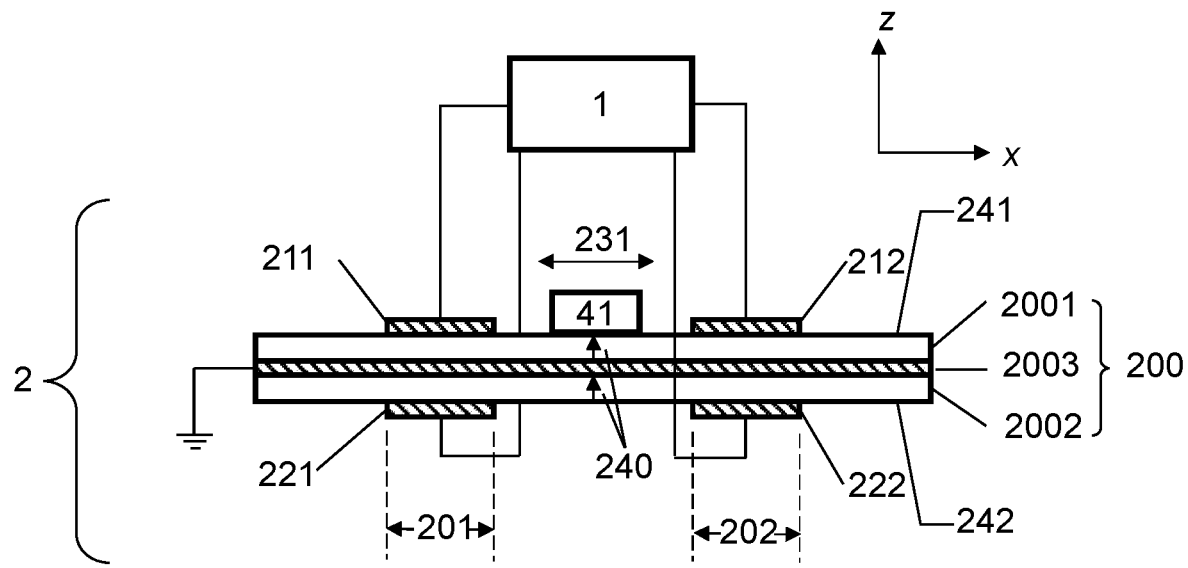
FIG. 5B graphs a two-frequency-two-mode linear piezoelectric apparatus having two one-dimensional plates to serve as its mechanically flexible body, where the poling direction are in the same direction.
Figure 12A:
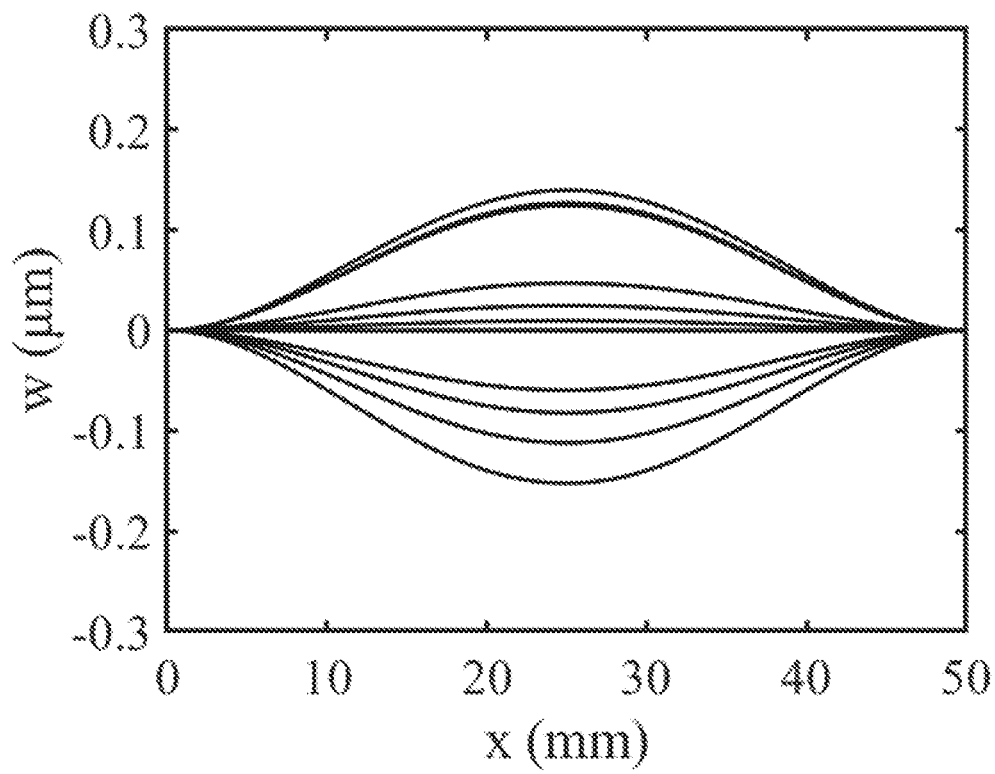
FIG. 12A shows the first resonant modes generated by one actuating area on a one-dimensional piezoelectric apparatus.

FIG. 5B shows another example of the present invention. The difference of this design and FIG. 12A is the poling directions 240 of the two one-dimensional plates are in same direction. The electrode 2003 is grounded, and the electrode pair 211 and 221 are driven at or near first driving frequency, and the electrode pair 212 and 222 are driven at or near the second driving frequency. The ratio of driving amplitude and phase difference are controlled to generate traveling waves on the piezoelectric apparatus along the x-axis. The phase difference between these two driving signals can be changed to control the traveling wave moves toward positive or negative directions along x-axis. The trajectory of the peak amplitude of the traveling wave is a rotational motion on the x-z plane. This motion can be used to propel the piezoelectric apparatus itself or to push a mechanical load 41 places on its surface.

Figure 6:
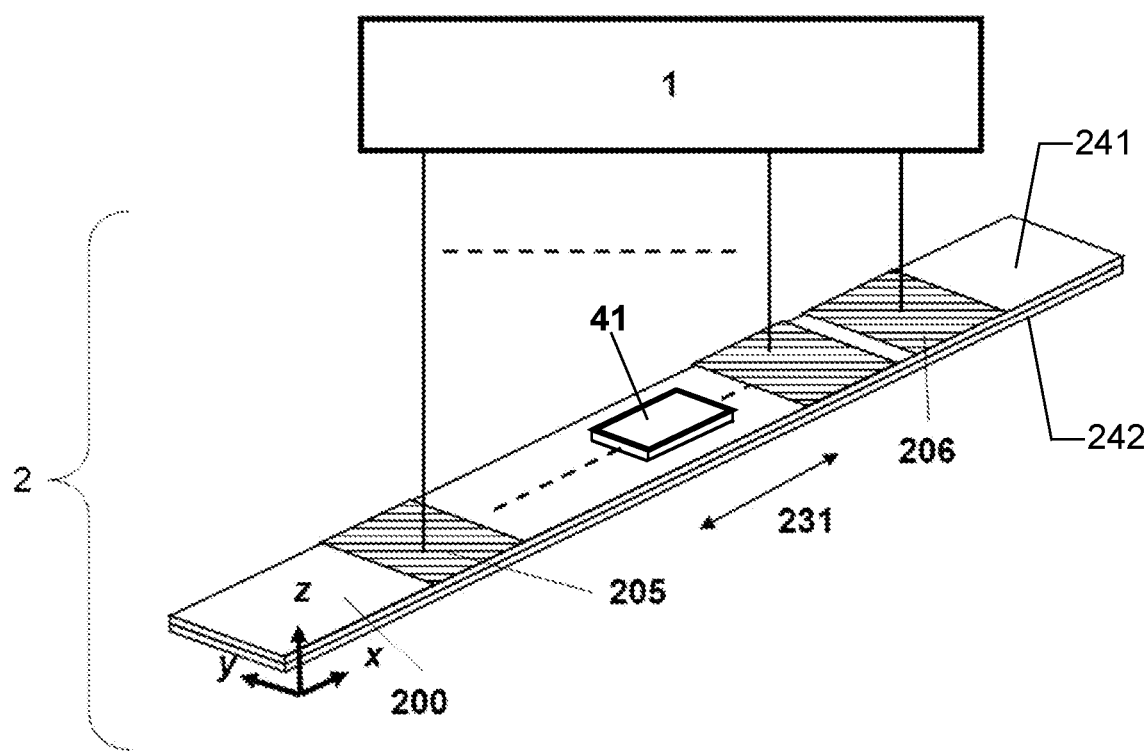
FIG. 6 graphs a piezoelectric apparatus having multiple actuating areas.

FIG. 6 is another example of the present invention. The design of the mechanically flexible body 200 is identical to the design of FIG. 5A or FIG. 5B. Symmetry boundary conditions can be used, including free-free, fixed-fixed, or simply supported on both ends. Multiple actuating areas from 205 to 206 are designed on one of the surfaces 241 of the mechanically flexible body 200. They are controlled by the electronic circuitry 1. The actuating areas are controlled to be driven at or near the resonant frequencies of two adjacent bending modes or any two bending modes along x-axis, and are separated into two groups to be driven by two separated bending modes or two groups of bending modes. The ratio of driving amplitudes and phase difference between each group of actuating areas are controlled to generate traveling waves and control its direction 231 and velocity for motorizing a mechanical load 41.

Figure 7:
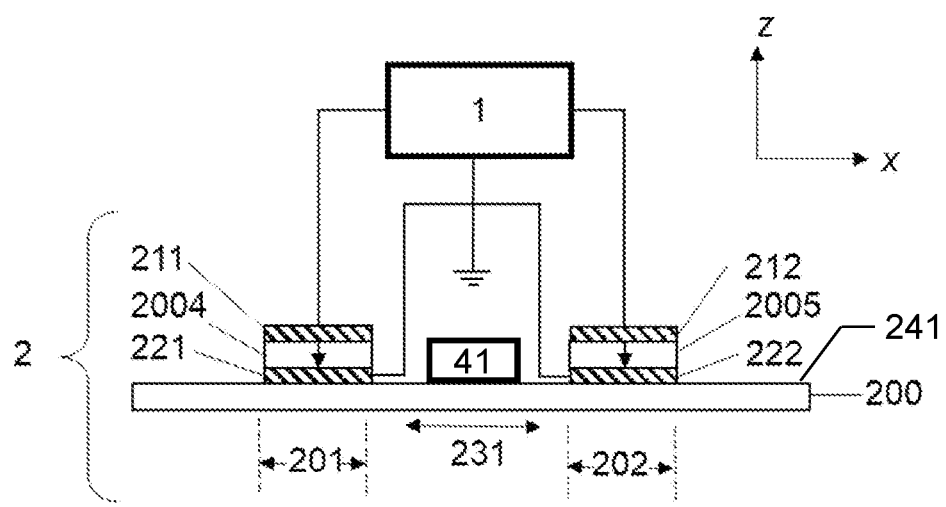
FIG. 7 graphs a two-frequency-two-mode piezoelectric apparatus having a one-dimensional flexible plate to serve as its mechanical structure, and two piezoelectric actuators attached to its surface to serve as the two actuating areas.

FIG. 7 shows another example of the present invention. The mechanically flexible body 200 is a one-dimensional flexible plate. Symmetry boundary conditions can be used, including free-free, fixed-fixed, or simply supported on both ends. Two actuating areas (201 and 202) are constructed by two piezoelectric actuators 2004 and 2005 with corresponding top and bottom electrodes 211 & 221 and 212 & 222. They are placed on one of the surfaces 241 of the mechanical flexible body 200. The locations and sizes of these two actuating areas are designed to generated traveling waves to propagate along x-axis by using two adjacent bending modes or any two bending modes along x-axis. The electronic circuitry 1 drive one of the actuating areas at or near the first bending mode and drive the other area at or near the second bending mode. The ratio of driving amplitude and phase difference between these two driving signals also are controlled to generate traveling waves on the piezoelectric apparatus with a desired direction 231. The phase difference between these two driving signals can also be changed to control the traveling wave moves toward positive or negative directions along x-axis. The trajectory of the peak amplitude of the traveling wave is a rotational motion on the x-z plane. This motion can be used to propel the piezoelectric apparatus itself or to push a mechanical load 41 places on its surface.

Figure 8:
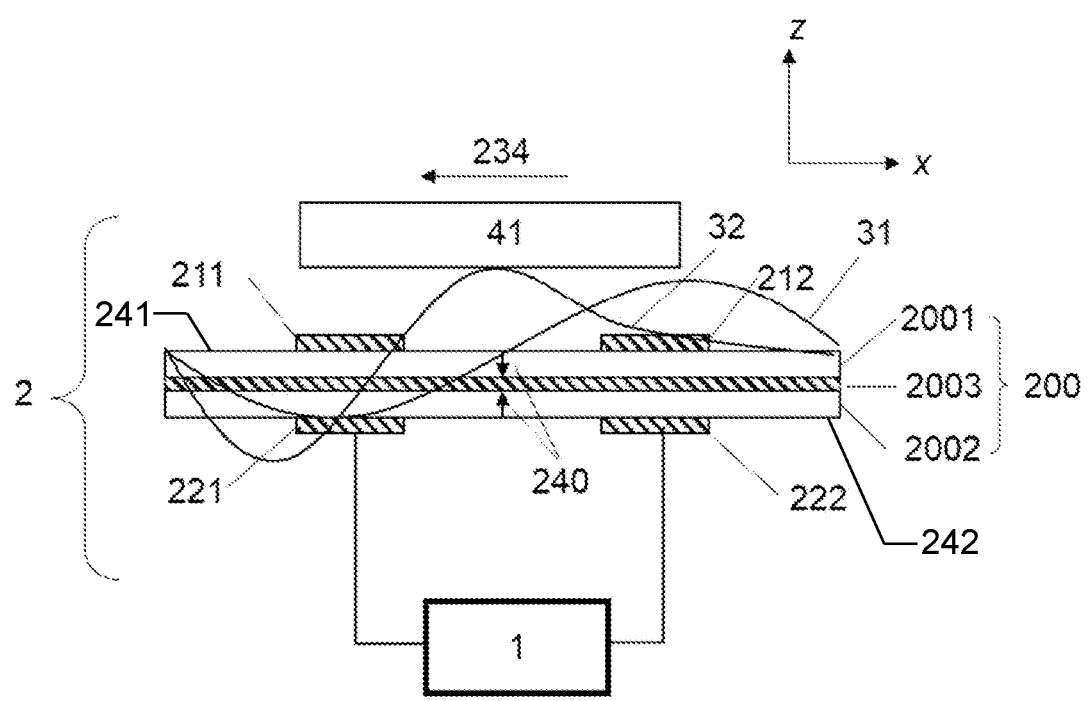
FIG. 8 graphs a one-dimensional two-frequency-two-mode piezoelectric apparatus for moving a mechanical load placed on its surface for one-dimensional movement.
Figure 13A:
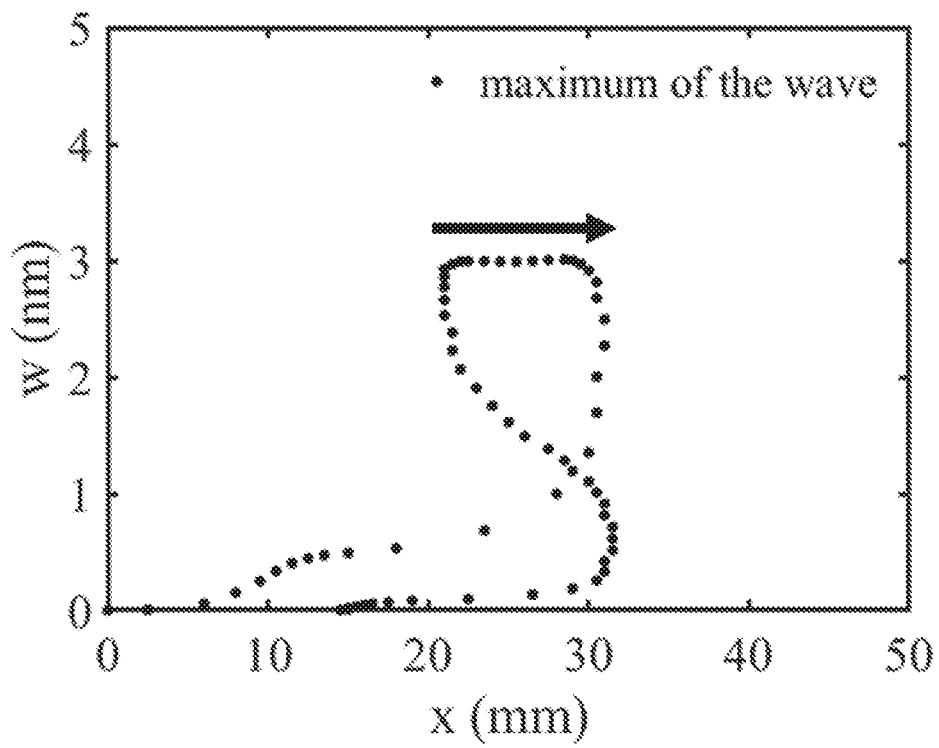
FIG. 13A shows the trajectory of the peak of a generated traveling wave by a one-dimensional piezoelectric apparatus having a 137-degree phase difference between two actuating areas.

FIG. 8 is another example of the present invention. The piezoelectric apparatus shown in FIG. 13A is used in this illustration, where two time-lapse profiles of generated traveling waves are shown from 31 to 32. This traveling wave can be used to move a mechanical load 41 placed on top of the piezoelectric apparatus. The piezoelectric apparatus is not limited to this configuration, it can be the examples shown in FIG. 5B, FIG. 6, or FIG. 7.

Figure 9:
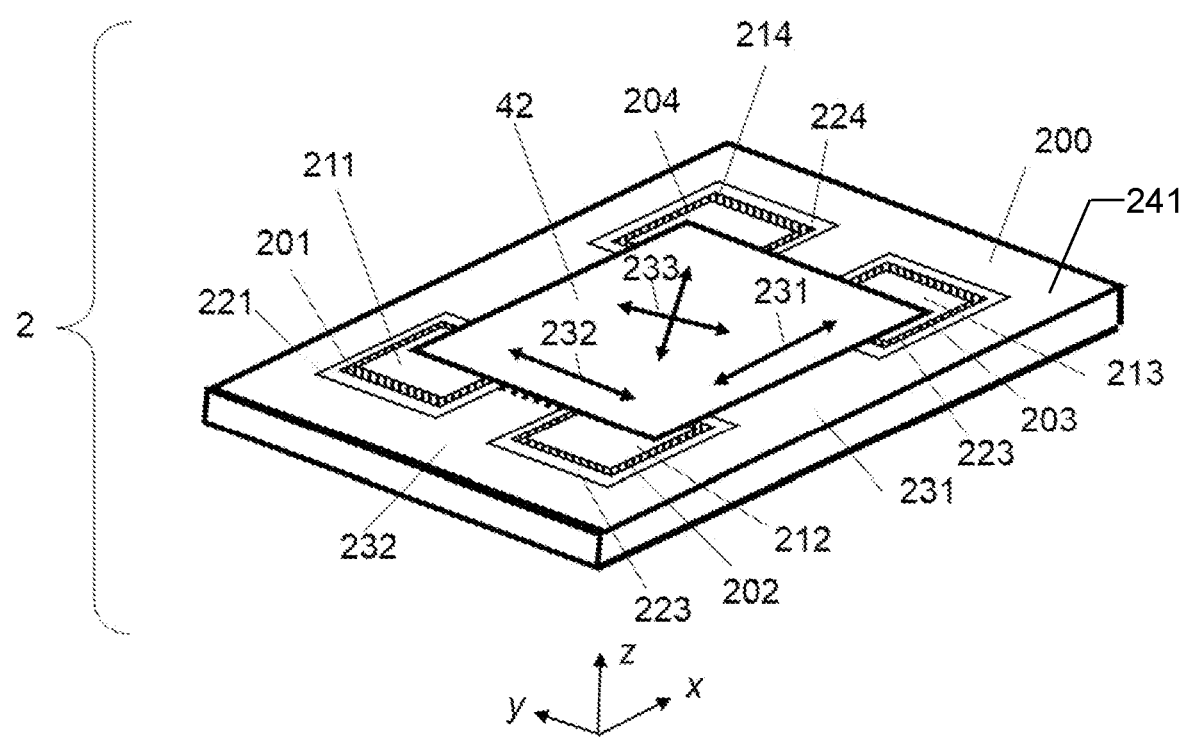
FIG. 9 graphs a two-dimensional piezoelectric apparatus for moving a mechanical load placed on its surface for two-dimensional movement.

FIG. 9 is another example of the present invention. The piezoelectric apparatus shown in FIG. 4 is used in this illustration. A mechanical load 42 is placed on top of the apparatus. The mechanical load can be moved by the traveling waves generated by the apparatus to move along x-axis 231, y-axis 232, and in oblique directions 233 on x-y plane.

Figure 10:
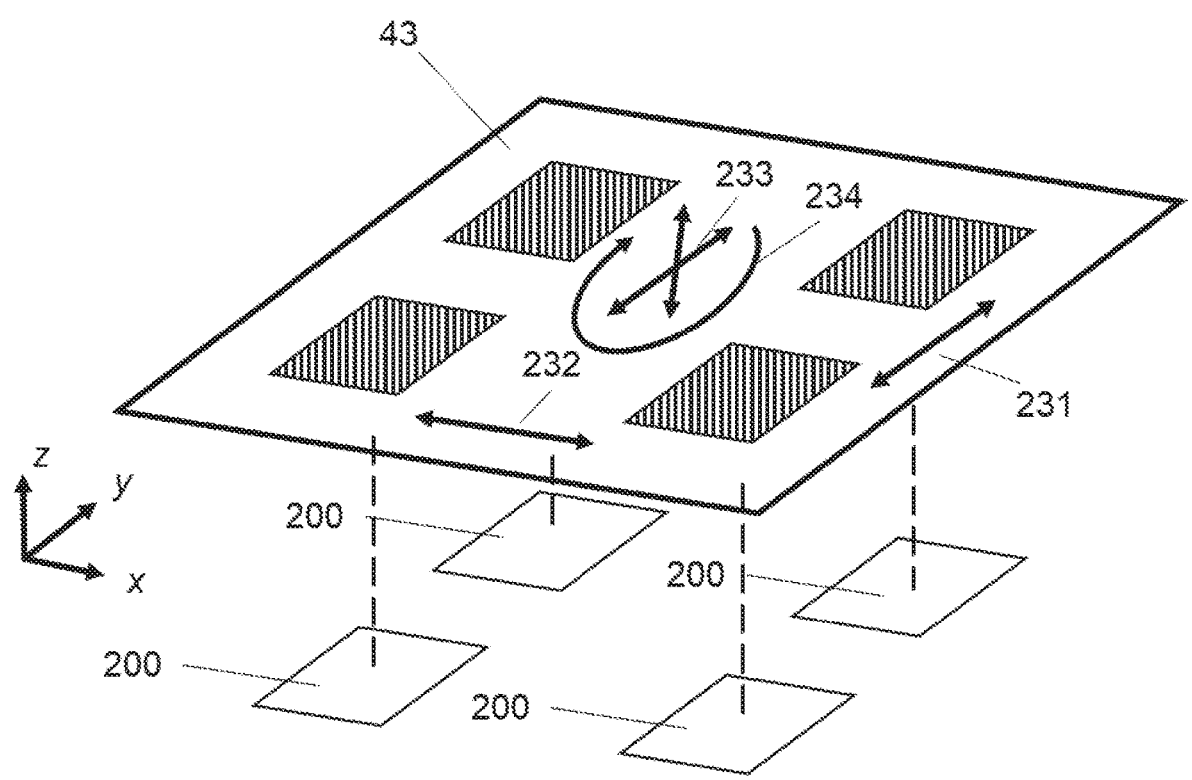
FIG. 10 graphs a two-dimensional piezoelectric apparatus where a mechanical load is driven two-dimensionally by four two-frequency-two-mode piezoelectric apparatus.

FIG. 10 is another example of the present invention. At least four piezoelectric apparatus 200 are place below a large mechanical load 43. Different directions of traveling waves can be generated on each piezoelectric apparatus, and different combinations can move the mechanical load to move along x-axis 231, y-axis 232, in oblique directions 233, and rotational 234 on x-y plane.

Figure 11:
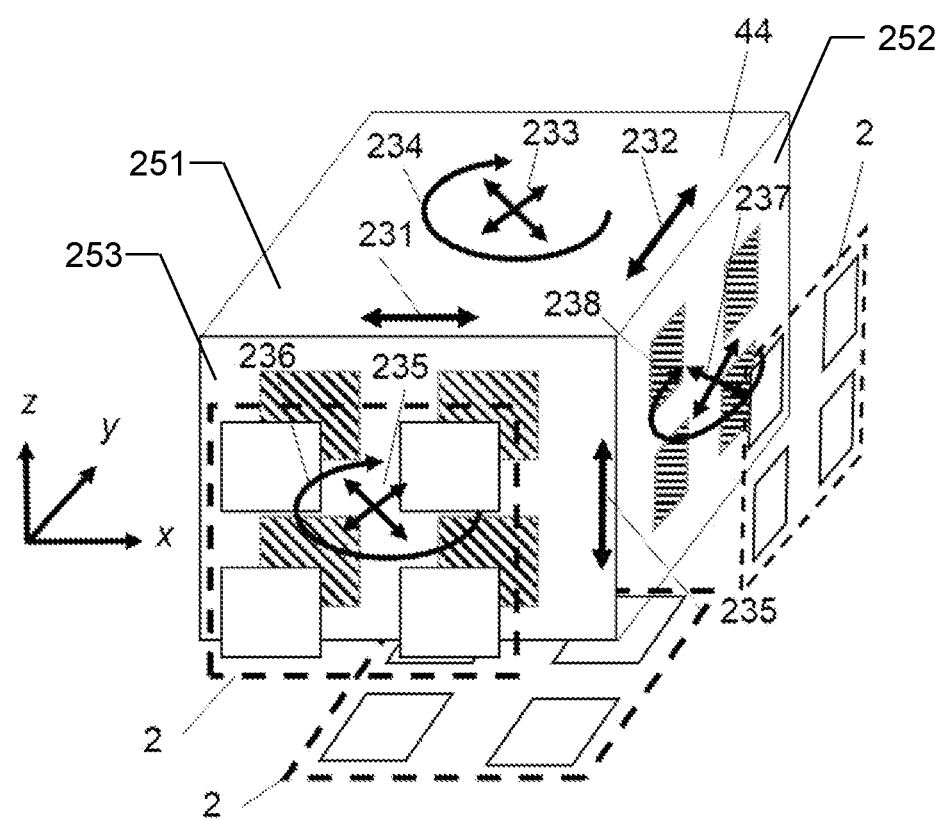
FIG. 11 graphs a three-dimensional piezoelectric apparatus where a three-dimensional mass is driven three-dimensionally by three two-dimensional piezoelectric apparatus.

FIG. 11 is another example of the present invention. At least 3 sets of piezoelectric apparatus 2 are placed on x-y 251, x-z 252, and y-z 253 planes of a three-dimensional mass 44. Each set has at least four piezoelectric actuators. Different combinations of traveling waves generated by each set of piezoelectric apparatus can moved the mechanical load to move along x-axis 231, y-axis 232, z-axis 233, in oblique directions on x-y plane 233, on x-z plane 235, on y-z plane 237, and rotational pattern with respect to x-axis 238, y-axis 236, z-axis 234.

Figure 12B:
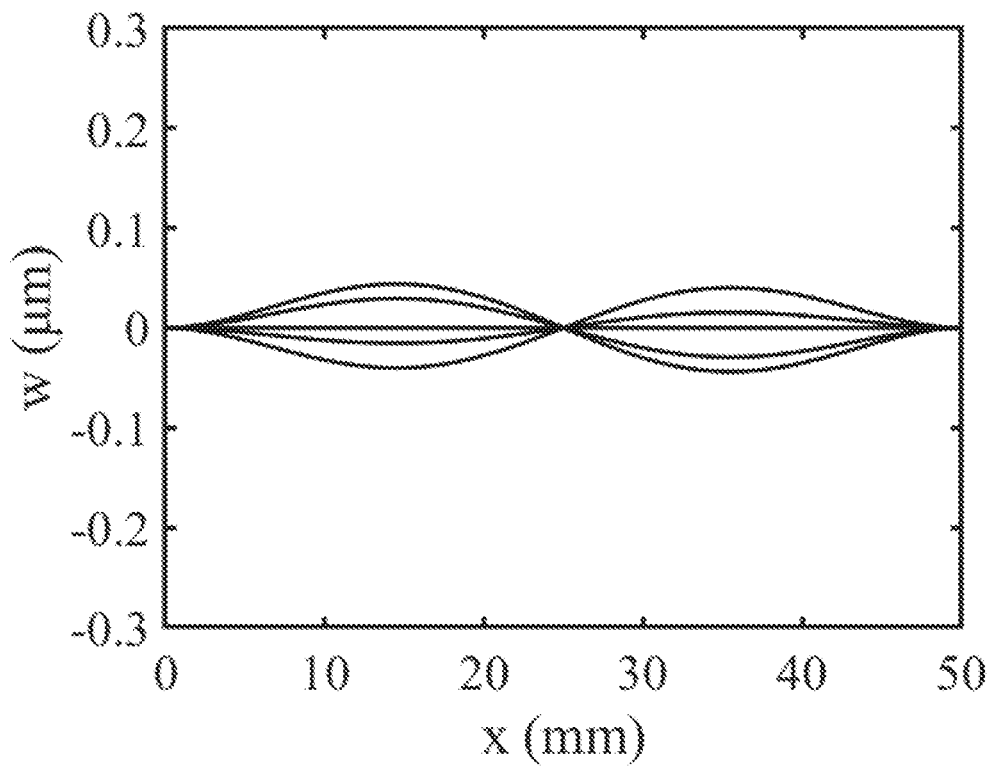
FIG. 12B shows the second resonant modes generated by one actuating area on a one-dimensional piezoelectric apparatus.
Figure 13B:
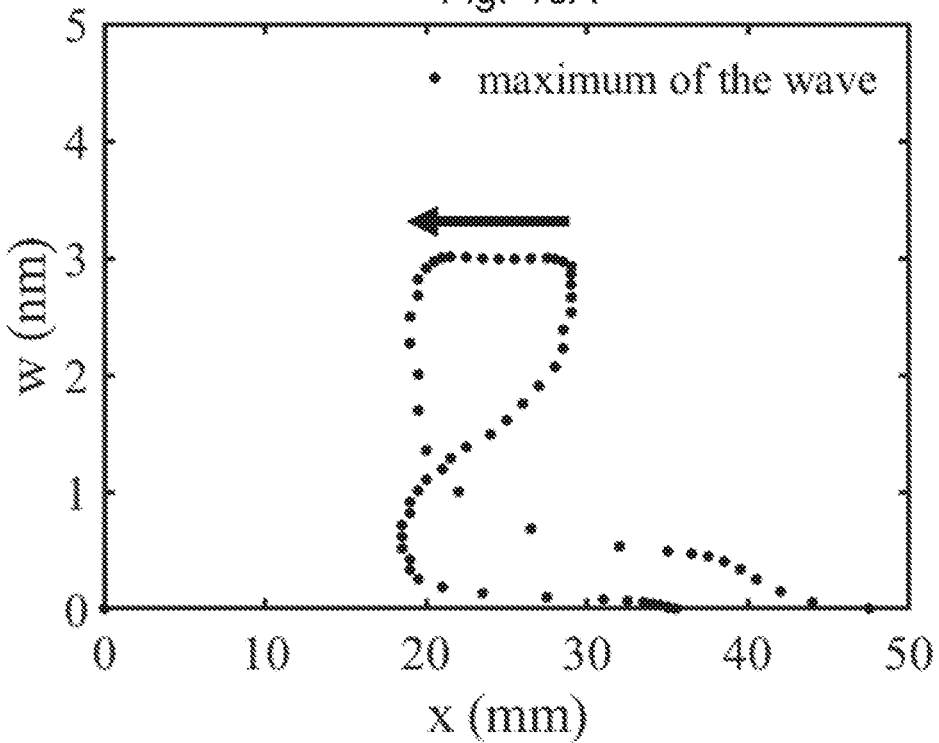
FIG. 13B shows the trajectory of the peak of a generated traveling wave by a one-dimensional piezoelectric apparatus having a 43-degree phase difference between two actuating areas.
Figure 14A:
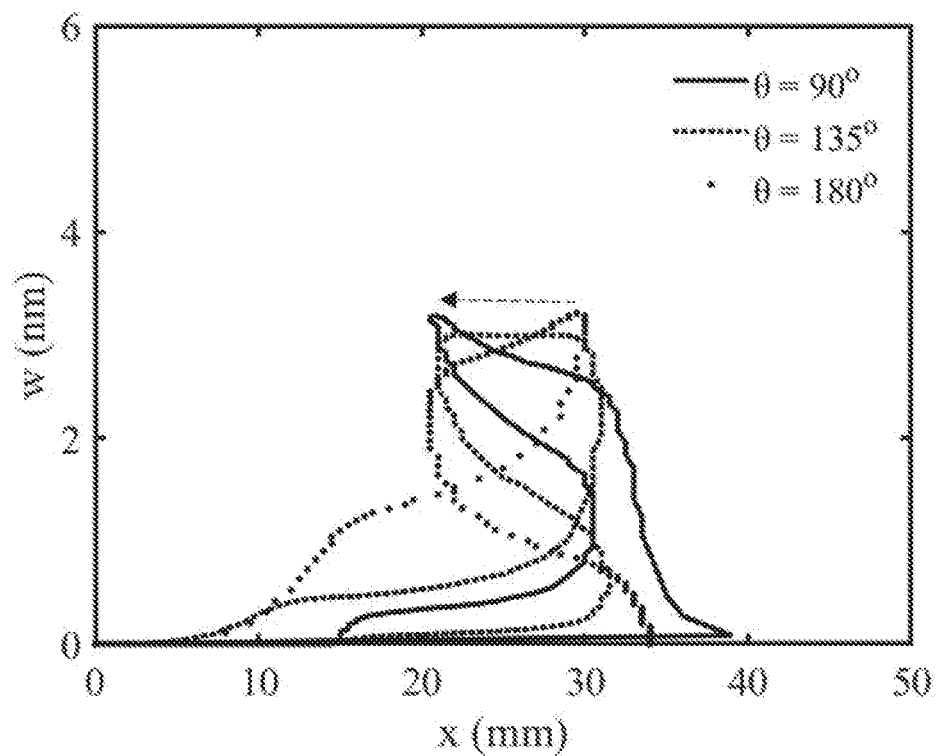
FIG. 14A shows the trajectory of the peak of generated traveling wave by a one-dimensional piezoelectric apparatus having a different phase difference between two driving frequencies.
Figure 14B:
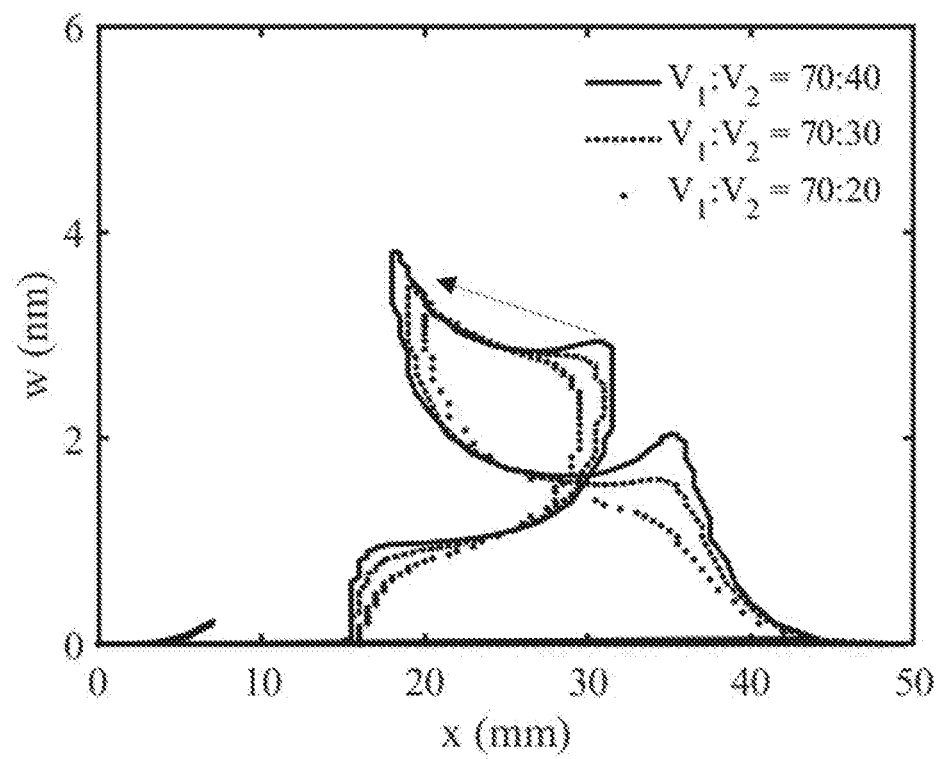
FIG. 14B shows the trajectory of the peak of generated traveling wave by a one-dimensional piezoelectric apparatus having different amplitude ratio between two driving frequencies.

Taking Example 2 (FIG. 5A) as an example with fixed-fixed boundary conditions, electrodes 211 and 221 are driven at the first bending mode, and the first bending mode is excited as shown in FIG. 12A. Electrodes 212 and 222 are driven at the second bending mode with a 137-degree or a −43-degree phase difference with respect to the driving signal of electrodes 211 and 221. The second bending mode is excited as shown in FIG. 12B. Introducing a 137-degree phase difference with respect to the first mode, the direction of the traveling wave moves to the right. FIG. 13A shows the numerical simulated result of the traced trajectory of the peak of the traveling wave. On the contrary, using a −43-degree phase difference between the first and the second bending modes, the traveling wave moves to the left as shown in FIG. 13B. Thus, 23.75% of the total length can have a repeated traveling waves generated for motorization. The phase difference can be used to control the shape of the traveling waves as shown in FIG. 14A, and it can change the resultant traveling velocity of the motor or a mechanical load placed on its surface. Furthermore, increase the amplitudes of the driving signal can control moving velocity. For example, controlling the ratio of driving amplitudes, the traveling waves can also be adjusted as shown in FIG. 14B, where the amplitude of the second mode was decreased. The traveling region is about the same. These results demonstrate that the ratio of driving voltage and phase difference between two actuators can be used to control the direction and velocity of a piezoelectric motor driven by the method of two-frequency-two-mode. This method can also be expanded to use two groups of multiple resonant frequencies to drive two groups of piezoelectric actuators as shown in FIG. 6. Under this optimal condition, the performance of the one-dimensional piezoelectric linear motor is significantly improved with a minimum usage of driving power.

Figure 15:
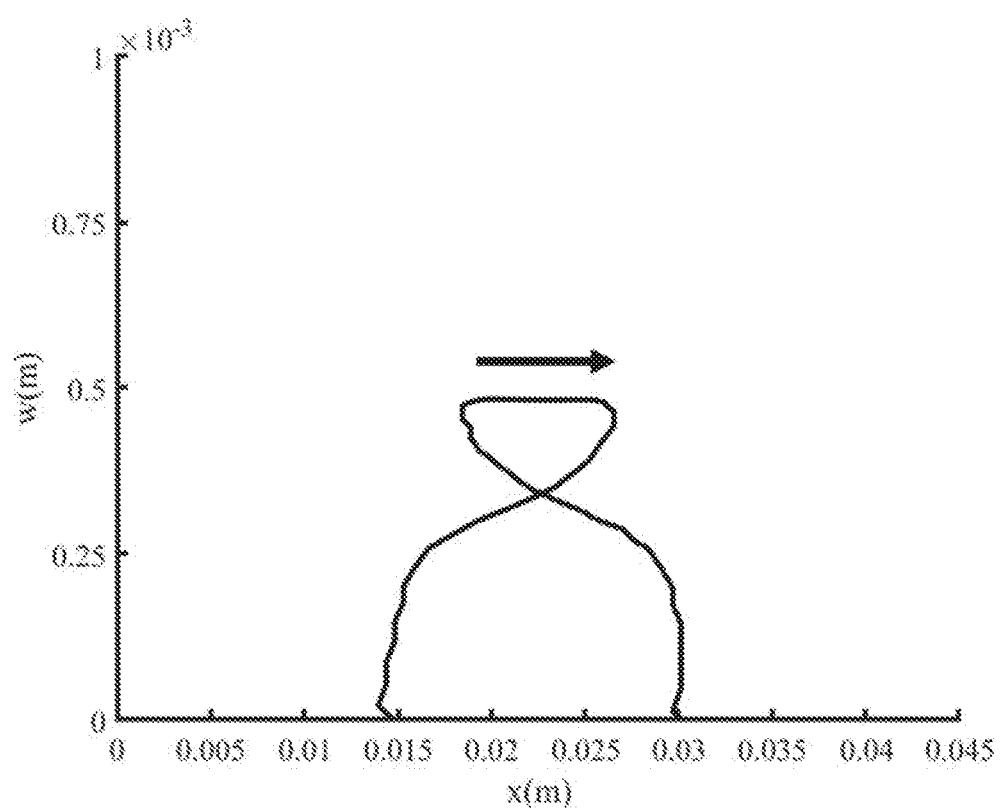
FIG. 15 shows the trajectory of the peak of generated traveling wave by a one-dimensional piezoelectric apparatus having a relationship of integer multiplication for the two driving frequencies

Another example of the present invention is the driving frequencies of the two actuating areas (paired electrodes 101 and 103 and the other paired electrodes 102 and 104 of Example 2 (FIG. 5A)) have a relationship of integer multiplication. For example, the boundary conditions of Example 2 are simply supported, and the frequencies of the second resonant mode is closely 2 times larger than the first resonant mode. Drive electrodes 211 and 221 with the first bending mode, and drive the second set of electrodes 212 and 222 at frequency two times higher than the first bending mode, a steady traveling wave can be generated as shown in FIG. 15.

While the above is a full description of specific embodiments of the present invention, various modifications, alternative constructions and equivalents may be used. Therefore, the above description and illustrations should not be taken as limiting the scope of the present invention.

What is claimed is:

1. A piezoelectric motorization system for driving mechanical loads multi-dimensionally by an electronic circuitry comprising:

a mechanically flexible body having one or more surfaces; and at least two groups of a plurality of piezoelectric actuators, each actuator being positioned on one of the one or more surfaces of the mechanically flexible body at a corresponding actuating area and being electrically connected to a corresponding output of the electronic circuitry;

wherein the electronic circuitry controls the driving of the mechanical loads by the mechanically flexible body by injecting at least two sets of control signals respectively into different groups of actuators positioned on the mechanically flexible body; and each control signal operates at least two groups of driving frequencies with an adjustable amplitude ratio and an adjustable phase difference among driving frequencies, and, under a set of boundary conditions exhibited by a set of structural dimensions of the mechanically flexible body, induces multi-mode resonance of the mechanically flexible body for driving the mechanical loads multi-dimensionally.

2. The piezoelectric motorization system of claim 1 wherein each driving frequency is at or near one resonant frequency of the mechanically flexible body and all driving frequencies are different and adjacent to each other.

3. The piezoelectric motorization system of claim 1 wherein each driving frequency is at or near one resonant frequency of the mechanically flexible body and all driving frequencies are different and not adjacent to each other.

4. The piezoelectric motorization system of claim 1 wherein each driving frequency is at or near one resonant frequency of the mechanically flexible body and each driving frequency has an integer relationship with respect to each other.

5. The piezoelectric motorization system of claim 1 wherein the driving frequencies are at or near the driving frequencies of out-of-plane resonant modes of the mechanically flexible body, including bending and/or twisting modes.

6. The piezoelectric motorization system of claim 1 wherein the driving frequencies for each piezoelectric actuator are a superposition of at least one frequency at or near different resonant modes of the mechanically flexible body.

7. The piezoelectric motorization system of claim 6 wherein the driving frequencies for each group of piezoelectric actuators are different.

8. The piezoelectric motorization system of claim 1 wherein the size, shape and location of all piezoelectric actuators determine a motorization direction and a velocity of the mechanical load.

9. A piezoelectric motorization system for driving mechanical loads multi-dimensionally by an electronic circuitry comprising:
a mechanically flexible body comprising at least one layer of piezoelectric plate having a top surface and a bottom surface; and
at least two groups of paired electrodes placed respectively on the top and the bottom surface of each piezoelectric plate and electrically connected to a corresponding output of the electronic circuitry;
wherein
the electronic circuitry controls the driving of the mechanical loads by the mechanically flexible body by injecting at least two sets of control signals respectively into different groups of paired electrodes positioned on the piezoelectric plate; and
each control signal operates at least two groups of driving frequencies with an adjustable amplitude ratio and an adjustable phase difference among driving frequencies, and, under a set of boundary conditions exhibited by a set of structural dimensions of the mechanically flexible body, induces multi-mode resonance of the mechanically flexible body for driving the mechanical loads multi-dimensionally.

10. A piezoelectric motorization system for driving mechanical loads of a three-dimensional mass multi-dimensionally by electronic circuitry, the three-dimensional mass having three mutually orthogonal surfaces, the system comprising:
a) at least three mechanically flexible bodies each having one or more surfaces and placed adjacent to a corresponding one of the three mutually orthogonal surfaces of the three-dimensional mass; and
b) at least two groups of a plurality of piezoelectric actuators, each group of piezoelectric actuators being positioned on one of the one or more surfaces of each mechanically flexible body at a corresponding actuating area and being electrically connected to a corresponding output of the electronic circuitry;
wherein
the electronic circuitry controls the driving of the mechanical loads by the mechanically flexible bodies by injecting at least two sets of control signals respectively into different groups of actuators positioned on each mechanically flexible body; and
each control signal operates at least two groups of driving frequencies with an adjustable amplitude ratio and an adjustable phase difference among driving frequencies, and, under a combination of a set of boundary conditions exhibited by a set of structural dimensions of each mechanically flexible body, induces multi-mode resonance of the mechanically flexible bodies for driving the mechanical loads of the three-dimensional mass multi-dimensionally and moving the three-dimensional mass on a corresponding plane of one of the three mutually orthogonal surfaces.

11. A method for a piezoelectric motorization system to drive mechanical loads multi-dimensionally by an electronic circuitry, the piezoelectric motorization system having a mechanically flexible body that has one or more surfaces and at least two groups of a plurality of piezoelectric actuators, each actuator being positioned on one of the one or more surfaces of the mechanically flexible body at a corresponding actuating area and being electrically connected to a corresponding output of the electronic circuitry, the method comprising:
the electronic circuitry injecting at least two sets of control signals respectively into different groups of actuators positioned on the mechanically flexible body for controlling the driving of the mechanical loads by the mechanically flexible body;
wherein
each control signal operates at least two groups of driving frequencies of the mechanically flexible body with an adjustable amplitude ratio and an adjustable phase difference among the driving frequencies, and, under a set of boundary conditions exhibited by a set of structural dimensions of the mechanically flexible body, induces multi-mode resonance of the body for driving the mechanical loads multi-dimensionally.

12. The method of claim 11 wherein each driving frequency is at or near one resonant frequency of the mechanically flexible body and all driving frequencies are different and adjacent to each other.

13. The method of claim 11 wherein each driving frequency is at or near one resonant frequency of the mechanically flexible body and all driving frequencies are different and not adjacent to each other.

14. The method of claim 11 wherein each driving frequency is at or near one resonant frequency of the mechanically flexible body and each driving frequency has an integer relationship with respect to each other.

15. The method of claim 11 wherein the driving frequencies are at or near the driving frequencies of out-of-plane resonant modes of the mechanically flexible body, including bending and/or twisting modes.

16. The method of claim 11 wherein the driving frequencies for each piezoelectric actuator are a superposition of at least one frequency at or near different resonant modes of the mechanically flexible body.

17. The method of claim 16 wherein the driving frequencies for each group of piezoelectric actuators are different.

18. The method of claim 11 wherein the size, shape and location of all piezoelectric actuators determine a motorization direction and a velocity of the mechanical loads.

* * * * *